(12) United States Patent
Buvid et al.

(10) Patent No.: US 10,136,563 B2
(45) Date of Patent: Nov. 20, 2018

(54) ACTIVE PERFORATION FOR ADVANCED SERVER COOLING

(71) Applicant: International Business Machines Corporation, Armonk, NY (US)

(72) Inventors: Daniel J. Buvid, Rochester, MN (US); Eric J. Campbell, Rochester, MN (US); Tyler Jandt, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 14/751,046

(22) Filed: Jun. 25, 2015

(65) Prior Publication Data

US 2016/0378124 A1 Dec. 29, 2016

(51) Int. Cl.
*G06F 1/20* (2006.01)
*H05K 7/20* (2006.01)
*G05D 23/19* (2006.01)

(52) U.S. Cl.
CPC ....... *H05K 7/20836* (2013.01); *G05D 23/192* (2013.01); *G06F 1/20* (2013.01); *H05K 7/20181* (2013.01); *H05K 7/20727* (2013.01)

(58) Field of Classification Search
CPC . G06F 1/20; G06F 1/203; G06F 1/206; G06F 2200/201; H05K 7/20;

(Continued)

(56) References Cited

U.S. PATENT DOCUMENTS 3,698,587 A 10/1972 Baker et al.
3,867,728 A 2/1975 Stubstad et al.
(Continued)

FOREIGN PATENT DOCUMENTS

WO 2004055656 A1 7/2004

OTHER PUBLICATIONS

Abhari et al. "A Comprehensive Study of Micropumps Technologies", 2012, International Journal of Electrochemical Science.*
(Continued)

*Primary Examiner* — Jason D Mitchell
(74) *Attorney, Agent, or Firm* — Patterson + Sheridan, LLP

(57) ABSTRACT

Embodiments of the present disclosure generally relate to the thermal management and regulation of electronic equipment. Microfluidic channels are utilized to actively change the aerodynamics of a surface, which may allow for the ability to change a surface texture from flat to raised, or dimpled, or from open to closed. The changing of the surface texture influences the fluid flow over or through the surface, thus allowing for thermal regulation of the surface. The thermal regulation system further controls fluid flow through an electronic device via a coating, or layer, having a plurality of active perforations thereon. The active perforations may open and close to increase and decrease the inlet of air to the system in order to help balance the back pressure in the system and redirect airflow to more sensitive system components. Active perforations may be individually opened and/or closed depending on location and system component utilization.

20 Claims, 11 Drawing Sheets

(58) Field of Classification Search
CPC ........... H05K 7/20145; H05K 7/20181; H05K 7/20709–7/20745; H05K 7/20836; G05B 15/02; G05B 21/02
USPC ...................................................... 700/828
See application file for complete search history.

(56) References Cited

U.S. PATENT DOCUMENTS

| | | | |
|---|---|---|---|
| 5,580,033 A | 12/1996 | Burkley et al. | |
| 6,340,874 B1 | 1/2002 | Vladimir | |
| 6,485,625 B1 | 11/2002 | Simpson et al. | |
| 6,501,654 B2* | 12/2002 | O'Connor | B81B 1/00 165/80.4 |
| 6,525,936 B2 | 2/2003 | Beitelmal et al. | |
| 6,992,381 B2* | 1/2006 | Kim | H01L 23/473 165/104.11 |
| 7,144,616 B1 | 12/2006 | Unger et al. | |
| 7,315,448 B1 | 1/2008 | Bash et al. | |
| 7,320,457 B2 | 1/2008 | Heim et al. | |
| 7,394,182 B2 | 7/2008 | Pelrine et al. | |
| 7,701,643 B2 | 4/2010 | Batchko et al. | |
| 7,898,176 B2 | 3/2011 | Li et al. | |
| 8,019,481 B2* | 9/2011 | Yamaguchi et al. | 700/282 |
| 8,730,673 B2* | 5/2014 | Vos | H01L 23/427 257/686 |
| 8,845,403 B2 | 9/2014 | Archibald et al. | |
| 9,907,210 B2 | 2/2018 | Buvid et al. | |
| 2001/0029983 A1 | 10/2001 | Unger et al. | |
| 2002/0029814 A1 | 3/2002 | Unger et al. | |
| 2002/0117517 A1* | 8/2002 | Unger | B01L 3/0268 222/214 |
| 2002/0136861 A1 | 9/2002 | Funakoshi | |
| 2002/0144738 A1 | 10/2002 | Unger et al. | |
| 2002/0164816 A1* | 11/2002 | Quake | G01N 27/4067 436/151 |
| 2003/0080442 A1 | 5/2003 | Unger | |
| 2004/0190252 A1* | 9/2004 | Prasher | F28D 15/0266 361/699 |
| 2005/0015026 A1 | 1/2005 | Well et al. | |
| 2005/0016887 A1 | 1/2005 | Yewdall et al. | |
| 2005/0045480 A1* | 3/2005 | Krumme | A61K 9/0024 204/639 |
| 2005/0160752 A1* | 7/2005 | Ghoshal | G06F 1/203 62/259.2 |
| 2005/0249607 A1* | 11/2005 | Klee | B01L 3/50273 417/207 |
| 2005/0266582 A1* | 12/2005 | Modlin | B01L 3/502723 436/164 |
| 2006/0130923 A1 | 6/2006 | Lepola et al. | |
| 2006/0241542 A1 | 10/2006 | Gudnason et al. | |
| 2007/0172837 A1 | 7/2007 | Schleifer et al. | |
| 2007/0183935 A1 | 8/2007 | Clemmens et al. | |
| 2008/0152510 A1* | 6/2008 | Krumme | F04B 43/02 417/300 |
| 2008/0210322 A1 | 9/2008 | Unger et al. | |
| 2008/0277007 A1 | 11/2008 | Unger et al. | |
| 2009/0061755 A1 | 3/2009 | Calder et al. | |
| 2009/0192653 A1 | 7/2009 | Songukrishnasamy et al. | |
| 2009/0302064 A1 | 12/2009 | Lavabre | |
| 2010/0064610 A1 | 3/2010 | Kulkarni et al. | |
| 2010/0143848 A1 | 6/2010 | Jain et al. | |
| 2010/0151781 A1 | 6/2010 | Slessman et al. | |
| 2010/0192306 A1 | 8/2010 | Dennis et al. | |
| 2011/0072589 A1 | 3/2011 | Dennis et al. | |
| 2011/0245981 A1* | 10/2011 | Refai-Ahmed | G06F 1/206 700/282 |
| 2012/0024389 A1* | 2/2012 | Renna | F04B 43/043 137/1 |
| 2012/0136488 A1* | 5/2012 | Tan | H05K 7/20836 700/278 |
| 2012/0204577 A1* | 8/2012 | Ludwig | F25B 21/04 62/3.3 |
| 2013/0000736 A1* | 1/2013 | Coico | F17D 3/00 137/2 |
| 2013/0063888 A1* | 3/2013 | Wang | H05K 7/20736 361/679.48 |
| 2013/0065501 A1* | 3/2013 | Wang | H05K 7/20181 454/184 |
| 2013/0068427 A1 | 3/2013 | Williams et al. | |
| 2013/0093289 A1 | 4/2013 | Zhang | |
| 2013/0205822 A1* | 8/2013 | Heiland | H05K 7/2079 62/259.2 |
| 2014/0148086 A1* | 5/2014 | Cash | H05K 7/20736 454/184 |
| 2014/0240916 A1* | 8/2014 | Daidzic | B23P 15/26 361/679.46 |
| 2014/0261630 A1 | 9/2014 | Morgan | |
| 2014/0323968 A1 | 10/2014 | Rogers et al. | |
| 2015/0090113 A1 | 4/2015 | Galloway | |
| 2015/0107233 A1 | 4/2015 | Ou et al. | |
| 2015/0113875 A1* | 4/2015 | Liotta | A01G 31/02 |
| 2015/0133593 A1 | 5/2015 | kissell et al. | |
| 2015/0237711 A1 | 8/2015 | Rogers et al. | |
| 2015/0297394 A1 | 10/2015 | Young | |
| 2016/0027737 A1 | 1/2016 | Rogers et al. | |
| 2016/0381830 A1* | 12/2016 | Buvid | H05K 7/20618 165/80.4 |
| 2017/0200707 A1 | 7/2017 | Rogers et al. | |

OTHER PUBLICATIONS

Iverson et al., "Recent advances in microscale pumping technologies: a review and evaluation." Microfluidics and nanofluidics 5.2 (2008), Birck and NCN Publications, Jan. 2008 pp. 145-174.

Xu et al., "Development, characterization, and theoretical evaluation of electroactive polymer-based micropump diaphragm." Sensors and Actuators A: Physical 121.1 (2005): 267-274.

Piyasena et al. "Electroosmotically driven microfluidic actuators." Sensors and Actuators B: Chemical 141.1 (2009): 263-269.

Khosla et al., "Fabrication of multiwalled carbon nanotube polydimethylsiloxne nanocomposite polymer flexible microelectrodes for microfluidics and MEMS." SPIE Smart Structures and Materials+ Nondestructive Evaluation and Health Monitoring. International Society for Optics and Photonics, 2010.

David Salerno, Linear Technology; Journal of Analog Innovation—vol. 20 No. 3, Oct. 2010, "Ultralow Voltage Energy Harvester Uses Thermoelectric Generator for Battery-Free Wireless Sensors", pp. 1-10. <http://cds.linear.com/docs/en/lt-journal/LTJournal-V20N3-01-df-LTC3108_09-David_Salerno.pdf>.

Anonymous (Wikipedia Author), http://en.wikipedia.org/wiki/Thermostat, article dated prior to Mar. 2009.

Dolomite Peristaltic Pumps, The Dolomite Centre Ltd—©, The Dolomite Centre Ltd 2010, retrieved Jun. 25, 2015. <http://www.dolomite-microfluidics.com/webshop/pumps-peristaltic-pumps-c-38_48>.

Schmidt et al., "Challenges of data center thermal management", IEEE (IBM Journal of Research and Development), 2005.

O'Halloran et al.; AC 2012-3976: Power and Efficiency Measurement in a Thermoelectric Generator, American Society for Engineering Education, 2012.

Dearing et al., "Electro-Active Polymer (EAP) "Dimple" Actuators for Flow Control: Design and Characterisation", Department of Aeronautics, Imperial College, London, England (2010). <https://spiral.imperial.ac.uk:8443/bitstream/10044/1/15460/2/Sensors%20and%20Actuators%20A%20-%20Physical_157_2_2010.pdf>.

Joseph Bennington-Castro; "Smart Morphable Surfaces Can Dimple At Will, Reducing Air Drag", Materials Research Society, Jul. 10, 2014. <http://www.materials360online.com/newsDetails/47333>.

Tactus: A New Dimension of Touch, Tactus Technology © 2012, pp. 1-13. <http://tactustechnology.com/wp-content/uploads/2014/08/White-Paper-New-Tagged-PDF.pdf>.

Buvid et al., "Active Perforation for Advanced Server Cooling", U.S. Appl. No. 14/751,039, filed Jun. 25, 2015.

IBM "List of IBM Patents or Patent Applications Treated As Related".

* cited by examiner

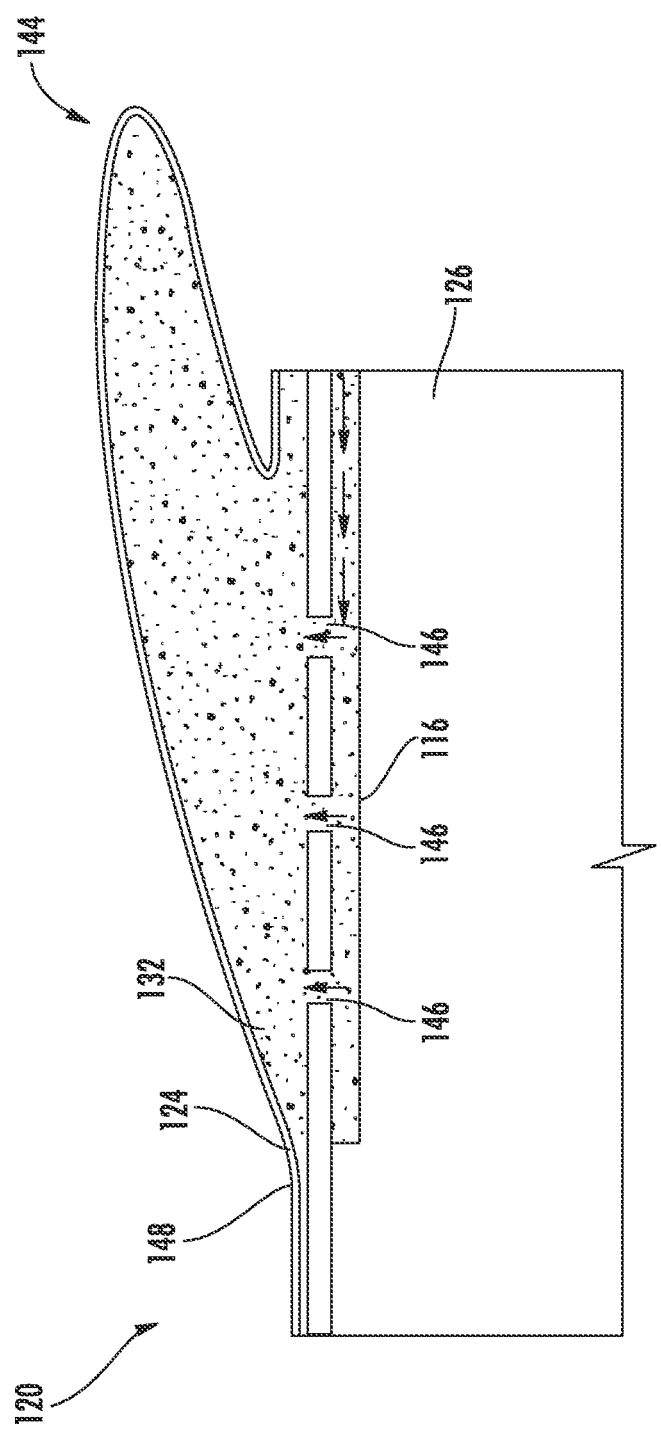

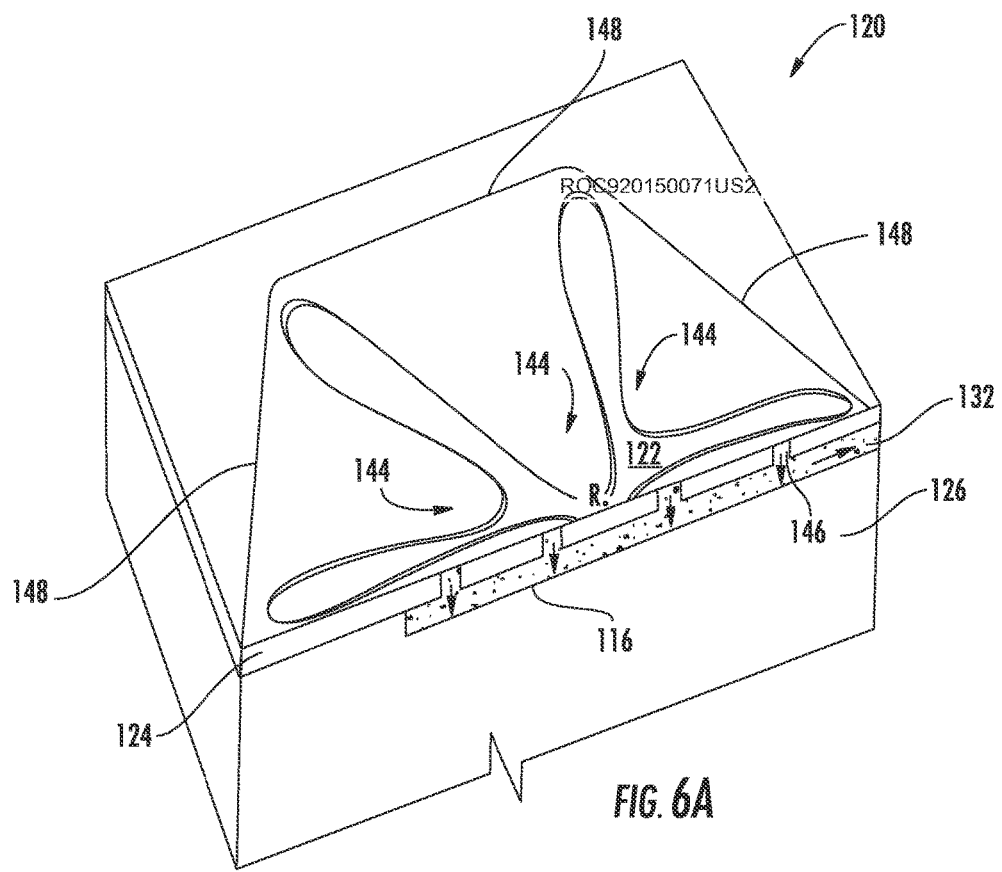

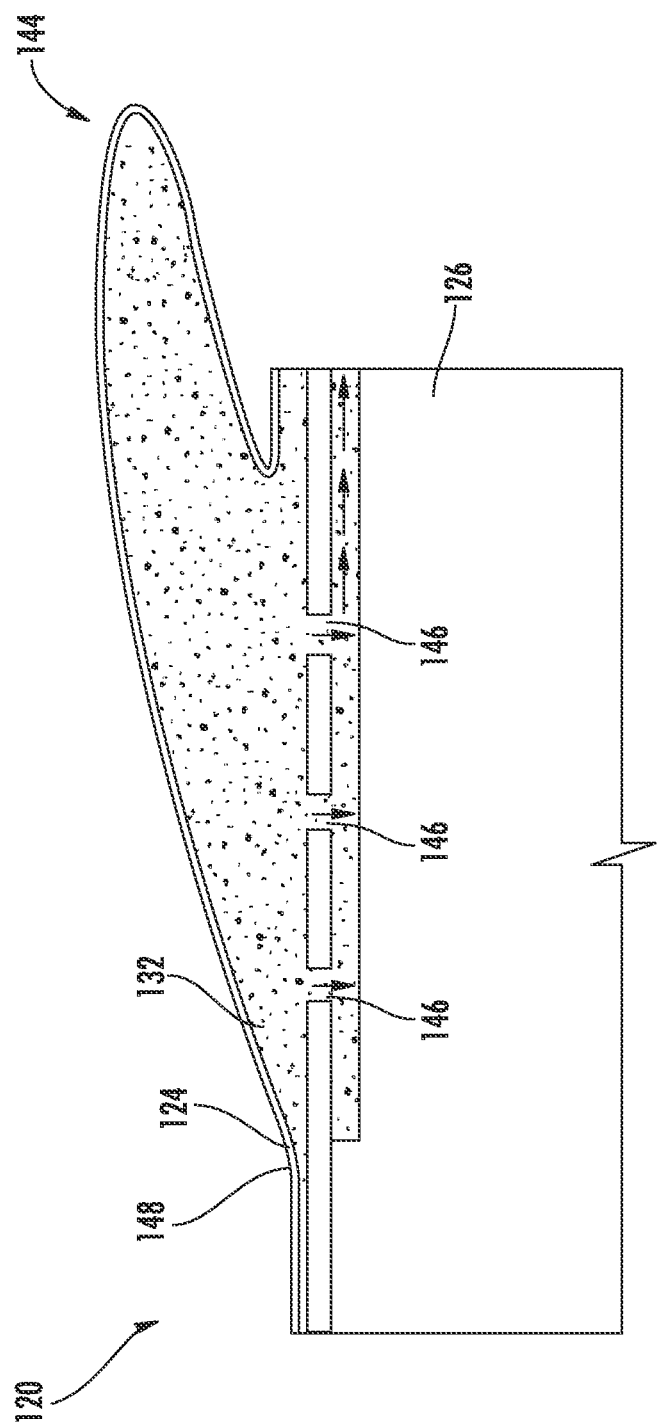

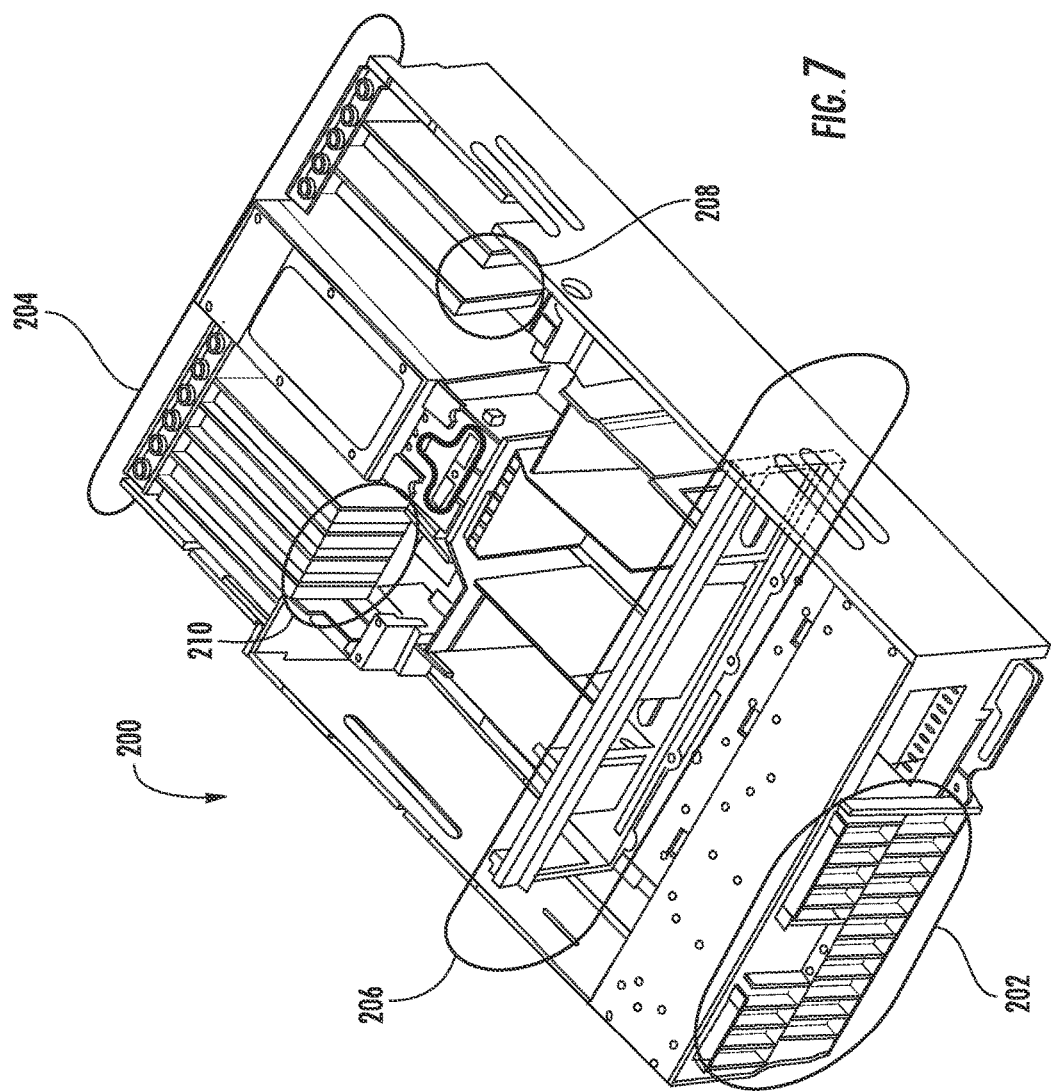

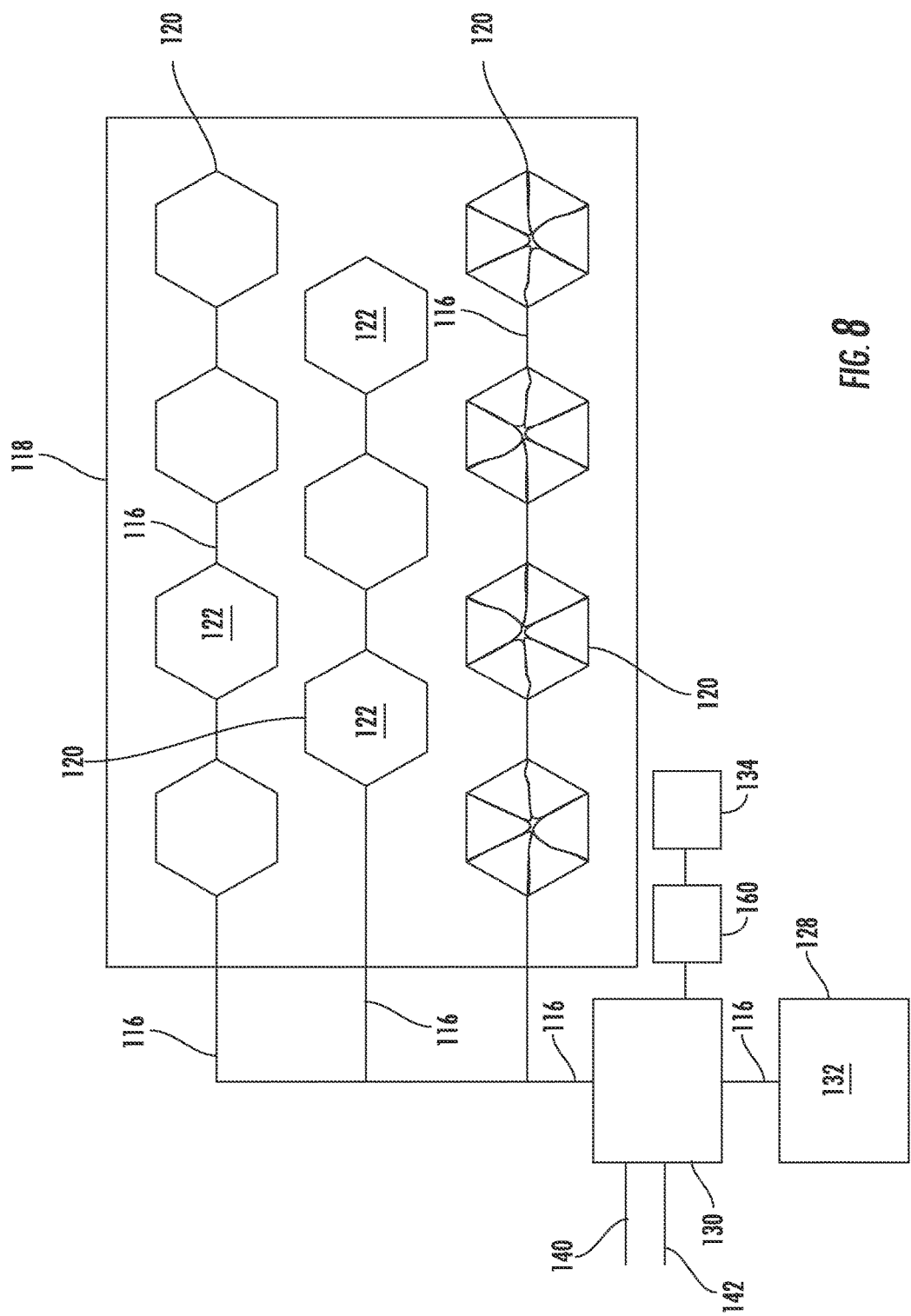

ACTIVE PERFORATION FOR ADVANCED SERVER COOLING

BACKGROUND

Embodiments of the present disclosure generally relate to thermal management of electronic equipment. More specifically, embodiments disclosed herein relate to a system and method for controlling fluid flow through an electronic device.

SUMMARY

Embodiments disclosed herein generally relate to the thermal management and regulation of electronic equipment. Microfluidic channels may be utilized to actively change the aerodynamics of a surface, which may further allow for the ability to change a surface texture from flat to raised, or dimpled, or from open to closed. The changing of the surface texture influences the fluid flow over and/or into the surface, thus allowing for thermal regulation of the surface. The thermal regulation system further controls fluid flow through an electronic device via a coating, or layer, having a plurality of active perforations thereon. The active perforations may open and close to increase and decrease the amount of fluid, such as air, flowing into the system in order to help balance the back pressure in the system and redirect airflow to more sensitive components. Active perforations may be individually opened and/or closed depending on location and component utilization.

In one embodiment, a device for providing thermal regulation of an electronic component is disclosed. The device includes a thermoelectric device, a microfluidic pump operatively connected with the thermoelectric device, a temperature sensor in operative communication with the electronic component and the thermoelectric device, and a self-activating active perforation layer. The self-activating active perforation layer may include a plurality of individual active perforations. Each of the plurality of individual active perforations may be coupled with an area of the electronic component. The individual active perforations each may have a controllable aperture for allowing fluid to pass therethrough. Furthermore, when a positive change in temperature above a normal operating temperature of the electronic component is received by the temperature sensor a voltage is generated by the thermoelectric device which powers the microfluidic pump. Powering the microfluidic pump may open the individual active perforations coupled to the area of the electronic component corresponding to the positive change in temperature.

In another embodiment, a device for providing thermal regulation of an electronic component is disclosed. The device includes a thermoelectric device, a microfluidic pump operatively connected with the thermoelectric device, a temperature sensor in operative communication with the electronic component and the thermoelectric device, and a self-activating active perforation layer. The self-activating active perforation layer may include a plurality of individual active perforations. Each of the plurality of individual active perforations may be coupled with an area of the electronic component. The individual active perforations each have a controllable aperture for allowing fluid to pass therethrough. Furthermore, when a negative change in temperature below a normal operating temperature of the electronic component is received by the temperature sensor a voltage is generated by the thermoelectric device which powers the microfluidic pump. Powering the microfluidic pump may close the individual active perforations coupled to the area of the electronic component corresponding to the negative change in temperature.

In yet another embodiment, a device for providing thermal regulation of an electronic component is disclosed. The device includes a thermoelectric device, a microfluidic pump operatively connected with the thermoelectric device, a temperature sensor in operative communication with the electronic component and the thermoelectric device, and a self-activating active perforation layer. The self-activating active perforation layer may be coupled to the electronic component. The self-activating active perforation layer may include at least two active perforations thereon. The at least two active perforations each may have a controllable aperture for controlling fluid flow therethrough to the electronic component. The controllable aperture of the first active perforation may be individually controllable from the controllable aperture of the second active perforation. Furthermore, when a positive change in temperature above a normal operating temperature of the electronic component is received by the temperature sensor a first voltage and a second voltage are generated by the thermoelectric device. The first voltage and the second voltage may each power the microfluidic pump to control the first active perforation in proportion to the first voltage and to control to second active perforation in proportion to the second voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIG. 5B illustrates a front plan view of fluid entering the active perforation of FIG. 5A, according to one embodiment.

FIG. 6A illustrates a perspective view of fluid exiting the active perforation, according to one embodiment.

FIG. 6B illustrates a front plan view of fluid exiting the active perforation of FIG. 6A, according to one embodiment.

FIG. 7 illustrates a perspective view of a computer system, according to one embodiment.

FIG. 8 illustrates a front plan view of the active perforation layer of the thermal regulation system, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
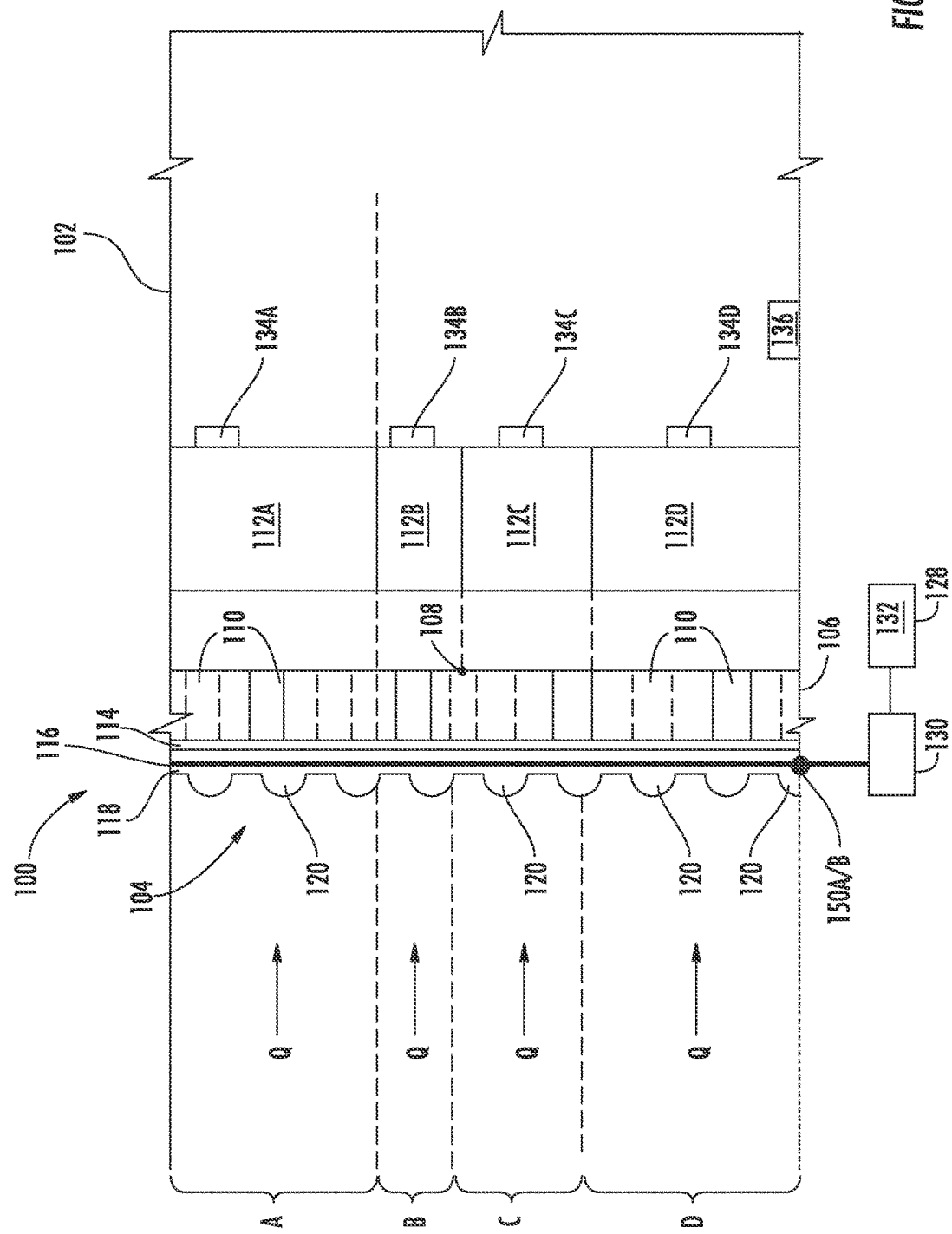
FIG. 1 illustrates a side cross-sectional view of a data center cabinet, according to one embodiment.

At the outset, it should be noted that although the embodiments disclosed are described with reference to electronic equipment, the disclosure may be practiced in any application requiring heat transfer or thermal regulation.

Data center equipment cabinets are typically used to house various types of electronic equipment such as servers and other computer system components. Data centers typically involve a large number of rack-mounted servers that are housed together in storage cabinets. When in use, processors and other electronic equipment housed within produce large amounts of heat which must be extracted because if the processors and electronic equipment are continually exposed to high temperatures, damage to the equipment may result and cause equipment failures. Similarly, individual computer electronic components may be housed within individual computer housings. The electronic components also produce large amounts of heat within the individual computer housings which must be extracted for similar reasons.

Heat must be dissipated at a rate sufficient to maintain critical system components at acceptable temperatures in order to prevent premature component or system failure. While small increases in operating temperatures may not be immediately damaging to the operation of the electronic components, long term operation at high temperatures may adversely affect component life and reliability. This is especially true for sensitive components such as data storage components or circuitry. Additionally, operating speeds and reliability of electronic systems may be negatively affected as the temperature of their individual components rises.

The maximum allowable temperature range for servers and other electronic equipment typically housed within a data center or other casing, such as for example only, a computer housing or casing, is between approximately about 59 degrees Fahrenheit and 95 degrees Fahrenheit. Typical ways to exchange heat within a data center or device may include the pumping of cold air into the data center or device, the utilization of a raised floor to act as a cooling agent, bores which function to permit cooling fluid to flow through the device, cabinet, or casing surrounding the data center or components in combination with fans, and/or the utilization of perforated floor tiles to cool components and other electronics.

Additional conventional approaches to providing heat transfer may include the use of a fan to draw cool air from outside the system into an enclosure in which system components may be located, the use of heat sinks, or increasing the air inlet bore size to allow more air into the enclosure.

However, rising processing speeds and high capacity circuits cause greater thermal loads, thus requiring greater air flow through the system to dissipate such heat quickly.

As the foregoing illustrates, there is a need for a system and method for cooling electronic equipment that efficiently and effectively delivers cooled air where needed to reduce the overheating of system components. Additionally, it would be beneficial to redirect cooled air to areas of need automatically. Therefore, what is needed is an active perforation for advanced server cooling.

Embodiments of the present disclosure generally relate to the thermal management and regulation of electronic equipment. Microfluidic channels may be utilized to actively change the aerodynamics of a surface, which may further allow for the ability to change a surface texture from flat to raised, or dimpled, or from open to closed. The changing of the surface texture influences the fluid flow over the surface, thus allowing for thermal regulation of the surface. The thermal regulation system may control fluid flow through an electronic device via a layer having a plurality of active perforations thereon. The active perforations may open and close to increase and decrease the inlet of air to the system in order to help balance the back pressure in the system and redirect airflow to more sensitive components. Active perforations may be individually opened and/or closed depending on location and component utilization. Still further, a combination of surface texture and active perforations may be employed to achieve thermal regulation.

FIG. 1 illustrates a side cross-sectional view of an electronic device 100. Examples of electronic devices may include, but are not limited to, a server, a personal computer, a laptop computer, a cellular telephone, etc. As illustrated in the embodiment of FIG. 1, the electronic device is a personal computing system. The electronic device 100 may, however, be any type of device which requires thermal regulation. The electronic device 100 includes a housing 102 surrounding and supporting components of the electronic device 100. The housing 102 may be, by way of example only, a data center cabinet, a server cabinet, a computer tower cabinet, a laptop case, or the like. As illustrated in the embodiment of FIG. 1, the housing 102 is a computer tower cabinet. The housing 102 may serve to protect the electronic device 100 by surrounding the components within the electronic device 100.

The housing 102 may surround, support, and protect system components 112 of the electronic device 100. Any number of system components 112 may be located and operatively connected within the housing 102. The system components 112 may be any component which contributes to the operation, functioning, appearance, support, form, maintenance, use, and/or setup of the electronic device 100. The system components 112 may include, for example, PCIe cards, graphics cards, interconnects, motherboards, CPUs, and the like. Although four system components 112A-112D are shown in the embodiment of FIG. 1, it is contemplated that any number of system components 112 may be utilized.

Each system component 112 of the electronic device 100 may be operatively connected with an individual temperature sensor 134. It is further contemplated that in some embodiments, areas within the electronic device 100 may be operatively connected with individual temperature sensors 134 rather than individual system components 112. In the embodiment shown in FIG. 1, each system component 112A-112D may be operatively connected with a temperature sensor 134A-134D, respectively. Each temperature sensor 134A-134D may detect in real-time the temperature of the corresponding system component 112A-112D.

The housing 102 of the electronic device 100 may have a perforation panel 106 on a first side 108 of the housing 102. The perforation panel may be an outer wall of the housing 102 and may protect the electronic device 100 encased within the housing 102. The perforation panel 106 may have one or more perforations 110, such as holes, slots, slits, or rings, therein, and the perforations 110 may be of any size. The perforations 110 may be sized large enough to allow fluid to enter the housing 102, however small enough to prevent undesired material from entering the housing 102. The perforations 110, however, are unable to control the amount of fluid entering the housing 102, as well as unable to direct the fluid to areas within the housing 102. Additionally, the perforation panel may be made of metal or any other suitable housing material.

As further shown in the embodiment of FIG. 1, the electronic device 100 may have a thermal regulation system 104. The thermal regulation system 104 may control fluid flow through the electronic device 100. The thermal regulation system 104 may be coupled with individual system components 112. The active perforation layer 118 may also be constructed onto a fan, such as, by way of example only, a housing enclosing the fan. Additionally, the thermal regulation system 104 may be coupled with the perforation panel 106 of the electronic device 100 via an adhesive layer 114. The adhesive layer 114 may be a fluid permeable adhesive. The adhesive layer 114 may be an adhesive applied around the outer perimeter of and between the thermal regulation system 104 and the perforation panel 106, such that the thermal regulation system 104 is coupled to the perforation panel 106. In another embodiment, the adhesive layer 114 may couple the thermal regulation system 104 with the perforation panel 106 via a layer of adhesive located between the thermal regulation system 104 and the perforation panel 106. It is contemplated that the thermal regulation system 104 may be directly coupled with the housing 102, the system components 112, and/or the perforation panel 106.

The thermal regulation system 104 may act to regulate and manage the temperature inside of the housing 102, the temperature of specific zones within the housing 102, and/or the temperature of specific system components 112 of the electronic device 100 by controlling the amount of fluid Q allowed to pass therethrough and into the electronic device 100, zone, or system component 112. The thermal regulation system 104 may comprise an active perforation layer 118. The active perforation layer 118 may be a polymer coating. The polymer coating may be a PDMS polymer. In some embodiments, the active perforation layer 118 may be a two part polymer coating (See FIGS. 5A, 5B, 6A, 6B). A first layer 124, such as a top layer, of the active perforation layer 118 may be an elastomeric layer. A second layer 126 of the active perforation layer 118 may be a substrate which provides a fluid channel 116, such as for example a microfluidic pathway, and a reservoir 128. In some embodiments, the reservoir may be expandable. The first layer 124 and the second layer 126 may be a PDMS polymer. Furthermore, the active perforation layer 118 may have a plurality of active perforations 120 thereon.

In some embodiments, the fluid channel 116 may be located within the active perforation layer 118 and between the active perforations 120 and the adhesive layer 114. In embodiments comprising a two part polymer coating, the fluid channel 116 may be located within the second layer 126, between the first layer 124 and the adhesive layer 114. The fluid channel 116 of each embodiment may operate in a substantially similar manner, and, therefore, the embodiment disclosed below may equally apply to either of the above disclosed embodiments. The fluid channel 116 may be operatively connected with the active perforations 120 at a first end and operatively connected with a reservoir 128 at a second end. Furthermore, the fluid channel 116 may have a fluid inlet 150A and a fluid outlet 150B. However, in some embodiments the fluid inlet 150A may also serve as the fluid outlet 150B, such that the flow direction of the fluid is reversed. The reservoir may store fluid 132, such as a liquid. A microfluidic pump 130 may be operatively connected with the fluid channel 116 between the active perforations 120 and the reservoir 128. The microfluidic pump 130 may pump, or drive, fluid 132 through the fluid channel 116 from the reservoir 128 to each of the plurality of active perforations 120 within the active perforation layer 118. In some embodiments, the fluid 132 pumped may be a low-shear fluid. In some embodiments the fluid 132 pumped may be a chemically inert fluid and/or an electrically inert fluid. An example of such fluid 132 may be, for purposes of illustration only, 3M® NOVEC. The fluid 132 may have a first temperature upon exiting the reservoir 128 and entering the fluid channel 116. However, after passing through the active perforation layer 118, thus cooling the system components 112, the fluid 132 may have a second temperature upon exiting the active perforation layer 118. The second temperature of the fluid 132 may be greater than the first temperature of the fluid 132 due to a heat exchange between the fluid 132 and the system component 112.

The active perforations 120 may extend outward from the active perforation layer 118, such that the active perforations 120 alter a surface dimension of the active perforation layer 118 to form, for example, a button or bubble radiating outward from the surface of the active perforation layer 118. Each active perforation 120 may have a diameter of between about two millimeters and about thirty millimeters, for example between about four millimeters and about ten millimeters. The active perforations 120 may allow for an increase or a decrease in the amount of fluid Q into the housing 102 of the electronic device 100. When open, each active perforation 120 may allow for fluid Q to flow through a controllable aperture 122 (See FIGS. 3, 4A, 4C, 5A, and 6A) of the active perforation 120. In some embodiments, the active perforations 120 may further be individually controlled. In some embodiments, individual groups of active perforations 120 may be controlled together. By controlling individual groupings of active perforations 120 together, designated areas, or zones, within the electronic device 100 and/or designated system components 112 may be individually cooled. By way of example, as shown in FIG. 1, the active perforations of group A may be controlled together to regulate the fluid Q flowing to the first system component 112A. The active perforations of group B may be controlled together to regulate the fluid Q flowing to the second system component 112B. The active perforations of group C may be controlled together to regulate the fluid Q flowing to the third system component 112C. Additionally, the active perforations of group D may be controlled together to regulate the fluid Q flowing to the fourth system component 112D. As such, by way of continued example, the active perforations of groups A and C may be opened, while the active perforations of groups B and D are closed to create zone specific control within the electronic device 100. Alternatively, by way of continued example, the active perforations of group D may be opened, while the active perforations of groups A, B, and C are closed to create zone specific control within the electronic device 100. By regulating the amount of fluid Q into the electronic device 100 and/or the individual system components 112A-112D, the back pressure within the electronic device 100 may be balanced.

For purposes of illustration only, and not intended to be limiting, the first system component 112A may be a PCIe card. Utilization of the first system component 112A may cause the first system component 112A to generate heat above a normal operating temperature of the first system component 112A. Extended use of a system component 112 at temperatures above the normal operating temperature may permanently damage or otherwise render inoperable the system component 112A. Therefore, fluid Q, such as air, must be directed to the system component 112A in order to cool the system component 112A to an acceptable and safe operating temperature. As such, when exercised at maximum utilization, system component 112A may require increased airflow, thus requiring the active perforations 120 within group A to be opened. The opening of the active perforations 120 within group A allows fluid Q to be directed at the system component 112A. Likewise, when the system component 112A is not being utilized, the active perforations 120 of group A may be closed. When closed, the active perforations 120 redirect fluid flow to other components. It is contemplated, however, that during periods of both usage and non-usage, the active perforations 120 within group A may be at a location substantially between open and closed.

The electronic device 100 may also include a controller 136. The controller facilitates the control and automation of the thermal regulation system 104. The controller 136 may be coupled to or in communication with one or more electronic devices 100, the thermal regulation system 104, the system components 112, the fluid channel 116, the active perforation layer 118, the active perforations 120, the reservoir 128, the microfluidic pump 130, and/or the temperature sensors 134. The thermal regulation system 104, the system components 112, the microfluidic pump 130, the reservoir 128, and/or the temperature sensors 134 may provide information to the controller 136 regarding active perforation 120 status, system component 112 or local environment temperature, fluid 132 movement, fluid 132 availability, microfluidic pump 130 functionality, and the like.

The controller 136 may include a central processing unit (CPU) (not shown), memory (not shown), and support circuits (or I/O) (not shown). The CPU may be one of any form of computer processors that are used in industrial settings for controlling various processes and hardware (e.g., pumps, temperature sensors and readings, motors, and other hardware) and monitor the processes (e.g., time, position, location, temperature, and the like). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller 136 determines which tasks are performable within the electronic device 100 and/or the thermal regulation system 104. The program may be software readable by the controller 136 and may include code to monitor and control, for example, the temperature, air flow, active perforation status, or fluid status within the electronic device 100 and/or the thermal regulation system 104.

Figure 2:
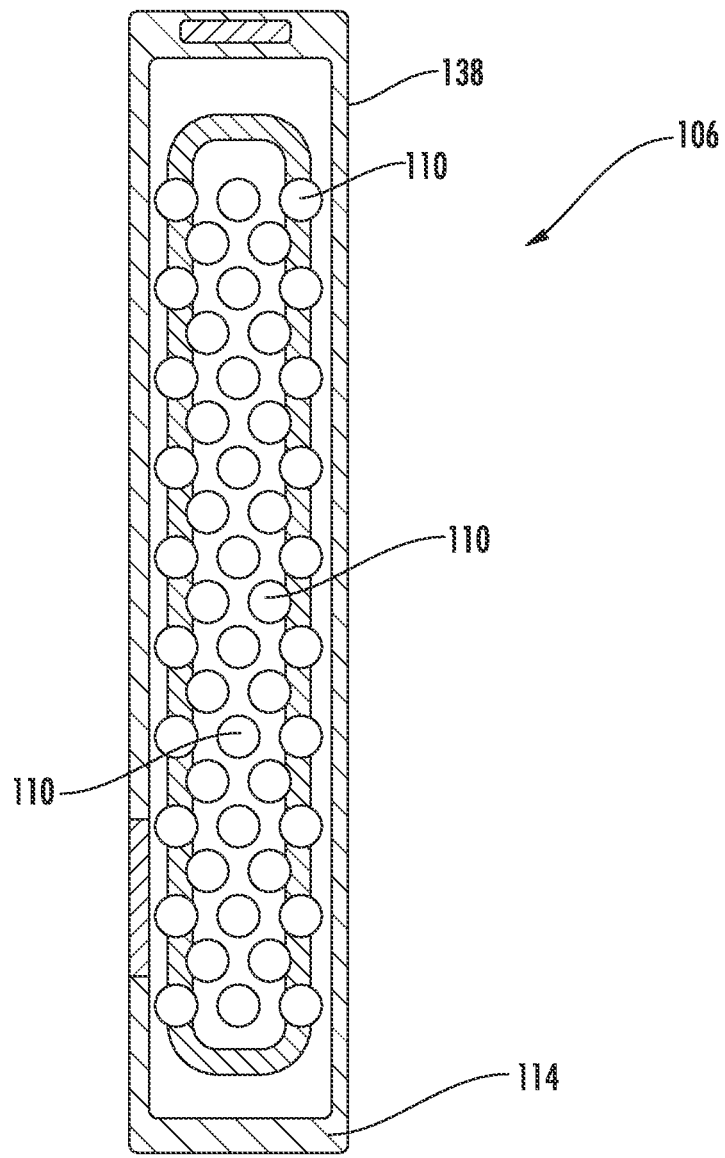
FIG. 2 illustrates a front plan view of the perforation panel of the data center cabinet of FIG. 1, according to one embodiment.

FIG. 2 illustrates a front plan view of the perforation panel 106 as shown in FIG. 1. The perforation panel 106 may be a plate with perforations 110, such as holes, slits, or slots, formed therein. The perforations 110 may be circular, ovular, rectangular, and/or of any suitable shape. The perforation panel 106 may be pre-formed on certain electronic devices 100, such as a server cabinet, a computer tower, or a laptop computer. However, the thermal regulation system 104 of the present disclosure may be added to an existing perforation panel 106. As discussed supra, the adhesive layer 114 may be around the outer perimeter 138 of the perforation panel 106. The adhesive layer 114 may be between the thermal regulation system 104 and the perforation panel 106, such that the thermal regulation system 104 is coupled to the perforation panel 106 via the adhesive. The perforations 110 of the perforation panel 106 of FIG. 2 may be permanent. As such, the perforations 110 themselves do not open or close.

Figure 3:
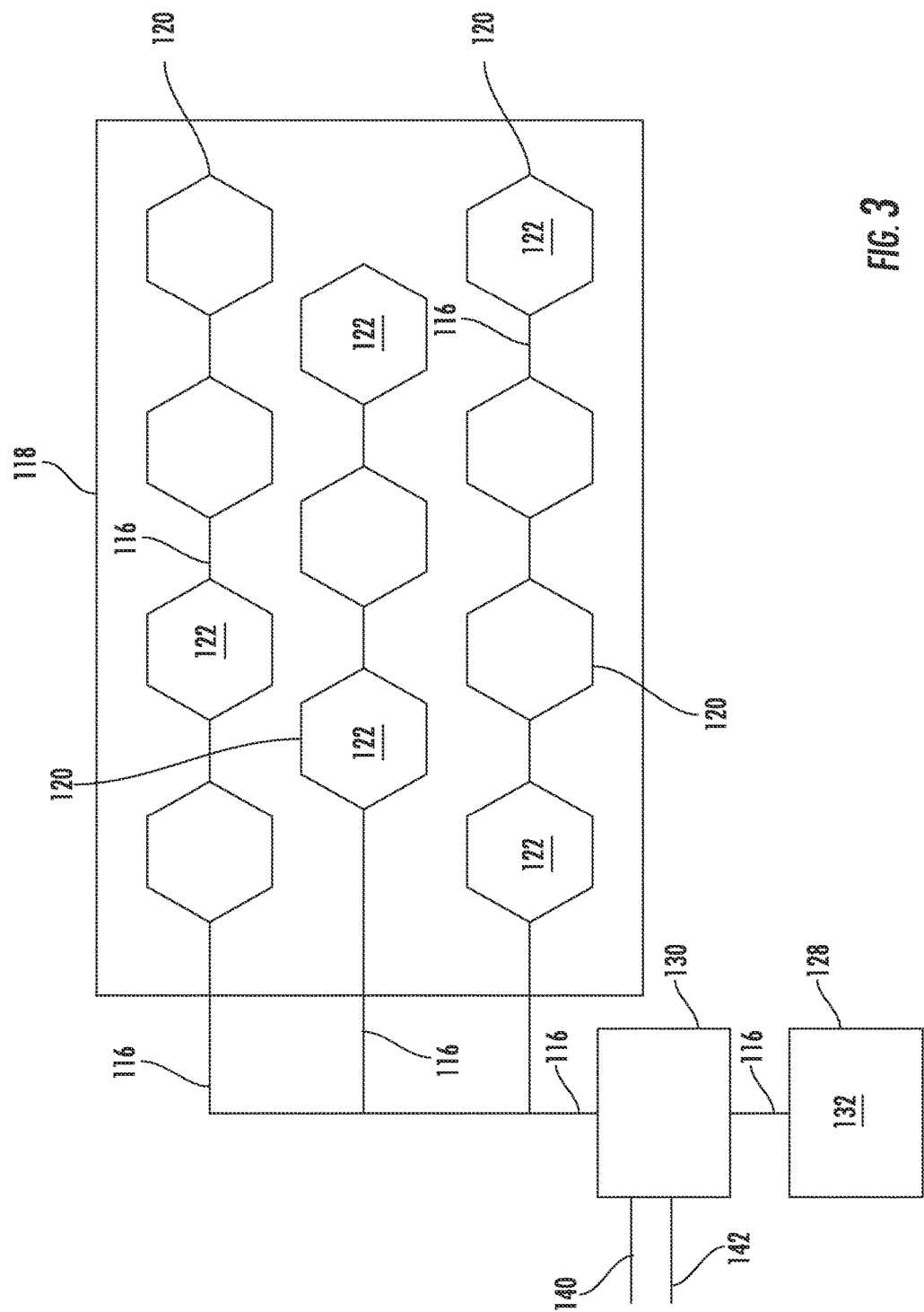
FIG. 3 illustrates a front plan view of the active perforation layer of the thermal regulation system, according to one embodiment.

FIG. 3 illustrates a front plan view of the active perforation layer 118 of the thermal regulation system 104. A plurality of active perforations 120 are disposed within the active perforation layer 118. In the embodiment of FIG. 3, the active perforations 120 represent Group A of FIG. 1, for example. The active perforations 120 are interconnected with each other via the fluid channel 116. The fluid channel 116 provides a pathway for the fluid 132 to activate each active perforation 120. The fluid channel is operatively connected to the microfluidic pump 130 to deliver the fluid 132 into the plurality of active perforations 120 via the fluid channel 116 to activate the active perforations 120 or may pump the fluid 132 out of the plurality of active perforations 120 to deactivate the active perforations. As such, the fluid 132 may flow in any direction within the fluid channel 116. In one embodiment, the microfluidic pump 130 may be a separate element coupled to the fluid channel 116 and the active perforation layer 118. In an alternative embodiment, the microfluidic pump 130 may be integrated within the active perforation layer 118. The microfluidic pump 130 may further be coupled to the reservoir 128 via the fluid channel 116. The microfluidic pump 130 may be operatively connected with a power supply 140 for powering the microfluidic pump 130, as well as operatively connected with the electronic device 100 via an electrical connection 142 as power may originate within the electronic device 100. Furthermore, as shown in FIG. 3, each active perforation 120 is in an open position such that an aperture 122 exists within each active perforation 120 of the active perforation layer 118.

The active perforation layer 118 of FIG. 3 may be coupled to the perforation panel 106 of FIG. 2 via the adhesive layer 114 such that the active perforation layer 118 covers the perforation panel 106. Each active perforation 120 of the active perforation layer 118 may correspond to and align with a single perforation 110 of the perforation panel 106. As such, each active perforation 120 of the active perforation layer 118 may be capable of opening to an aperture 122 having a diameter at least as large as a diameter of an individual perforation 110 of the perforation panel 106. Alternatively, each active perforation 120 of the active perforation layer 118 may be larger than an individual perforation 110 of the perforation panel 106. As such, an individual active perforation 120 of the active perforation layer 118 may have an aperture 122 large enough to expose more than one perforation 110 of the perforation panel 106. For example, activation of an individual active perforation 120 may open two or more perforations 110. Alternatively, each active perforation 120 of the active perforation layer 118 may be smaller than an individual perforation 110 of the perforation panel 106. As such an individual active perforation 120 of the active perforation layer 118 may not fully expose a full individual perforation 110 of the perforation panel 106. Therefore, multiple active perforations 120 may be grouped together in this embodiment to provide finer control over the fluid flow.

Figure 4A:
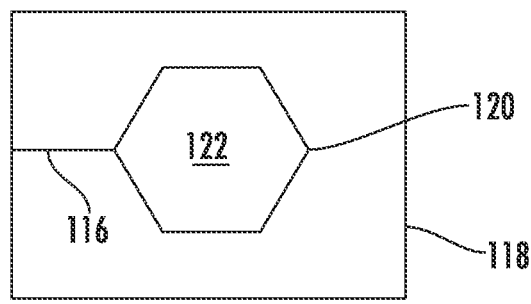
FIGS. 4A-4C each illustrate a front plan view of embodiments of the active perforation layer of FIG. 3, according to at least one embodiment.
Figure 4B:
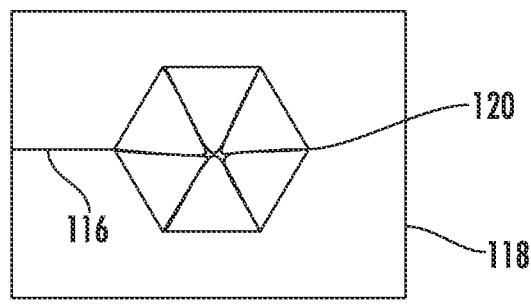
Figure 4C:
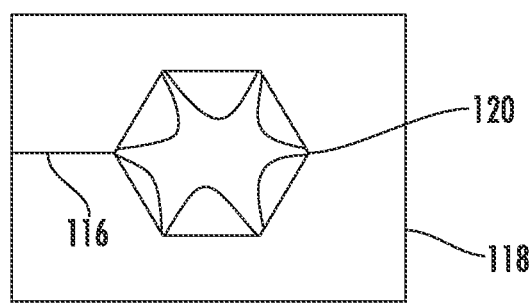

FIGS. 4A-4C illustrate embodiments of an individual active perforation 120 of the active perforation layer 118 in various positions. Each active perforation 120 maintains an aperture 122 controllable between at least a first closed position, a second open position, and a third partially open position. The position of the active perforation 120 may be determined by an input received from the temperature sensor 134. In the closed position, the aperture 122 is not exposed and the fluid flow is to be directed, or redirected, around the active perforation. In the open position, the aperture 122 is fully exposed and fluid flow therethrough is maximized. In the third position the aperture 122 is partially opened, regulating fluid flow between zero and fully open.

FIG. 4A illustrates a front plan view of an embodiment of an individual active perforation 120 of the active perforation layer 118 in the open position. When in the open position the full aperture 122 of the active perforation 120 is exposed and thus the active perforation 120 allows fluid, such as air, to be moved therethrough and access areas of high temperatures with the greatest rate of flow. Each active perforation 120 may be operatively connected to the fluid channel 116 such that fluid 132 may be pumped into or out of the active perforation 120. When the active perforation 120 is in the open position fluid 132 may be removed from the active perforation such that the microfluidic pump 130 moves fluid 132 away from and out of the active perforation 120. The open position of the active perforation 120 may be beneficial in that it allows for maximum fluid flow therethrough which may rapidly decrease the temperature of a system component 112 maintaining a temperature out of the acceptable temperature range and in immediate need of critical cooling.

FIG. 4B illustrates a front plan view of an embodiment of an individual active perforation 120 of the active perforation layer 118 in the closed position. When in the closed position, no portion of the aperture 122 is exposed and thus the active perforation 120 may not allow fluid, such as air, to be moved therethrough. The closed position may prohibit access to the perforation panel 106 thereunder. In order for the active perforation 120 to reach the closed position, fluid 132 may be pumped via the microfluidic pump 130 from the reservoir 128 to the active perforation 120 through the fluid channel 116. The closed position of the active perforation 120 may be beneficial in that it allows for fluid, such as air, flow to be redirected through and/or drawn to areas of need elsewhere within the electronic device in a short amount of time. As such, by closing active perforations 120 in areas where fluid flow is not required, such as in areas where system components 112 are not being utilized, the back pressure within the electronic device 100 may be balanced to ensure effective and efficient cooling of system components 112 being utilized.

FIG. 4C illustrates a front plan view of an embodiment of an individual active perforation 120 of the active perforation layer 118 in an intermediate position, wherein the intermediate position is between the open position and the closed position. When in the intermediate position the active perforation 120 may allow fluid, such as air, to be moved therethrough and access the perforation panel 106 and system components 112 within. In the intermediate position, a lesser amount of fluid may be allowed to pass through the active perforation 120 compared to the open position. In order for the active perforation 120 to reach the intermediate position, fluid 132 is pumped via the microfluidic pump 130 from the reservoir 128 to the active perforation 120 through the fluid channel 116; however, the fluid 132 may be pumped at a lower flow rate and/or for less time than the active perforation in the closed position. The intermediate position of the active perforation 120 may be beneficial in that it allows for fluid flow therethrough at a steady rate and may further allow for the maintaining of a stable temperature of a system component 112.

A temperature sensor 134 may be operatively connected to the controller 136, the thermal regulation system 104, and/or at least one system component 112 of the electronic device 100. The temperature sensor 134 receives real time information regarding the temperature of the system component 112. The controller 136 contains program logic storing information relating to a predetermined acceptable temperature range for each system component 112 of the electronic device. A predetermined acceptable temperature range for the system component 112 may be between approximately 59 and 95 degrees Fahrenheit, and between about 65 and 85 degrees Fahrenheit. When the temperature sensor 134 receives a temperature reading outside of the predetermined acceptable temperature range, the controller 136 directs the thermal regulation system 104 to open a single active perforation 120, a plurality of active perforations 120, a group of active perforations 120, and/or all active perforations 120 at least partially as shown in FIG. 4C or fully as shown in FIG. 4A. A maximum usage of the system component 112 may cause the system component temperature to elevate outside of the predetermined acceptable temperature range. The controller 136 may require maximum airflow through the active perforation 120 corresponding to the system component 112 for reducing the temperature of the system component 112. In such a case, the active perforations 120 corresponding to the area of the system component 112 may open fully as shown in FIG. 4A. During normal usage of the system component 112, the system component temperature may elevate to a temperature within the predetermined acceptable temperature range, however the temperature may be approaching the outer limits of the predetermined acceptable temperature range. The controller 136 may direct the thermal regulation system 104 to open a single active perforation 120, a plurality of active perforations 120, a group of active perforations 120, and/or all active perforations 120 at least partially as shown in FIG. 4C for reducing the temperature of the system component 112.

Figure 5A:
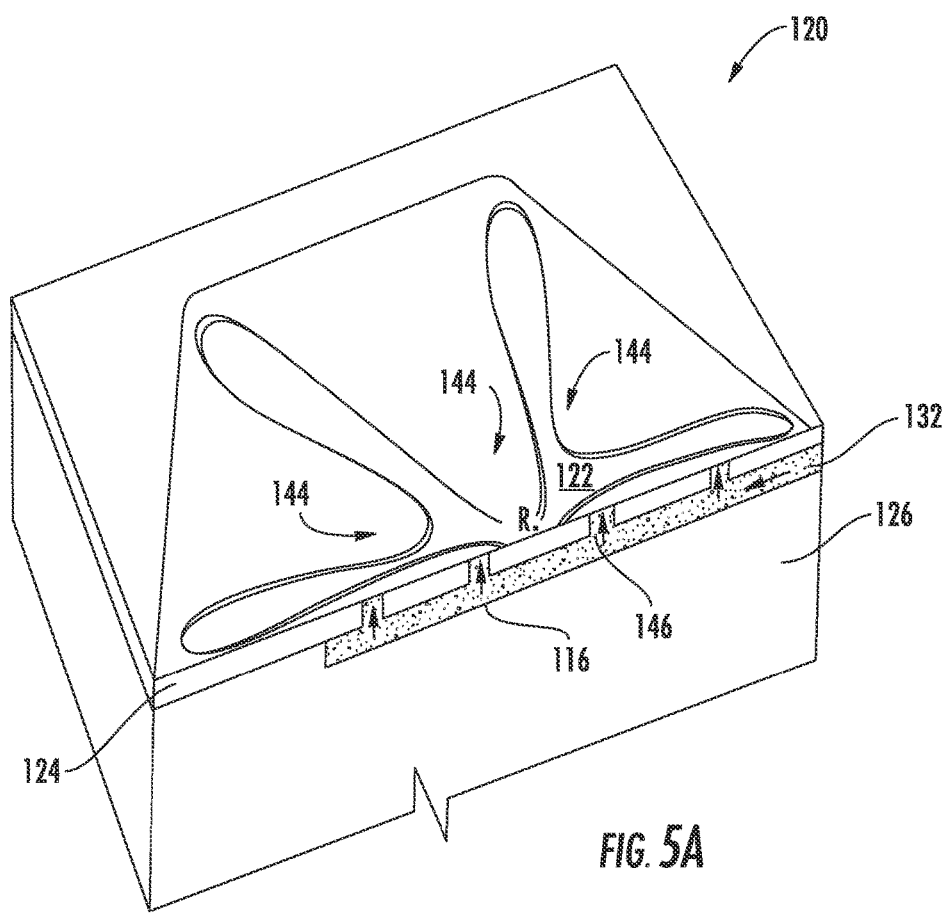
FIG. 5A illustrates a perspective view of fluid entering the active perforation, according to one embodiment.

FIGS. 5A and 5B illustrate fluid 132 entering the active perforation, according to one embodiment. In the embodiment shown, fluid 132 is delivered to the active perforation 120 to open the active perforation 120 and fully expose aperture 122.

Each active perforation 120 may be part of the active perforation layer 118. The active perforation 120 may be a polymer coating such as, by way of example only, a polydimethylsiloxane ("PDMS") polymer. The PDMS polymer may be a silicone based compound, such as a polymeric organosilicone compound. The active perforation layer 118 may maintain rheological properties such as being hydrophilic. Additionally, in certain embodiments, the active perforation layer 118 may be optically clear and/or inert. The active perforation layer 118 may be viscoelastic. In some embodiments, the active perforation layer 118 may be a two part polymer coating. A first layer 124, such as a top layer, of the active perforation layer 118 may be an elastomeric layer. A second layer 126 of the active perforation layer 118 may be a substrate which defines the fluid channel 116. The first layer 124 and the second layer 126 may each be a PDMS polymer.

In some embodiments, the fluid channel 116 may be located within the active perforation layer 118 and between the active perforations 120 and the adhesive layer 114. In embodiments comprising a two part polymer coating, the fluid channel 116 may be located within the second layer 126, between the first layer 124 and the adhesive layer 114. As shown in FIGS. 5A and 5B, the fluid 132 enters into the active perforation 120 via the fluid channel 116. Inlets 146 within the fluid channel 116 may direct the fluid 132 from the fluid channel 116 into the active perforation 120. Specifically, the fluid 132 may be directed into flaps 144 of the active perforation 120. The flaps 144 may be fluid sacks, or reservoirs, for holding fluid 132. The flaps 144 may be expandable reservoirs. In some embodiments, the flaps 144 may be compressible and expandable fluid sacks which hold a preformed shape when filled with fluid 132. When the flaps 144 are not filled with the fluid, the flaps 144 may compress.

As shown in FIGS. 4B and 4C, each active perforation 120 may have six flaps 144; however, it is contemplated that any number of flaps 144 may be utilized. When the active perforation 120 receives fluid, the flaps 144 fill with fluid, thus causing the flaps 144 to expand. The flaps 144 may expand toward a midpoint R of the aperture 122 of the active perforation 120 such that each flap 144 expands toward one another. Upon full expansion of each flap 144, the active perforation 120 closes as the aperture 122 becomes sealed by the flaps 144. When the active perforation 120 is closed, no fluid may pass therethrough.

As shown in FIGS. 6A and 6B, the fluid 132 exits the active perforation 120 via the fluid channel 116. The fluid 132 may be directed out of the flaps 144 via the microfluidic pump 130, through the inlets 146, and out of the fluid channel 116. When the active perforation 120 is to be open, the fluid may be removed from the flaps 144 via the microfluidic pump 130, thus causing the flaps 144 to retract. When the flaps 144 retract, each flap 144 may move radially away from the midpoint R, thus causing the aperture 122 to be exposed. The flaps 144 may compress toward an outer edge 148 of the active perforation 120. Once the flaps 144 have compressed to the outer edge 148 of the active perforation 120, the aperture 122 is fully exposed allowing fluid to pass therethrough.

The electronic device 100 may turn on with the active perforations 120 in the open position. Once the electronic device 100 is on, the thermal regulation system 104 is turned on and begins monitoring the temperature sensors 134 to determine which system components 112 are being utilized and may require thermal regulation in real time. The temperature reading from the temperature sensors 134 are used to determine which system components 112 require cooling and/or which system components 112 do not require cooling. If the thermal regulation system 104, after receiving the temperature readings from the temperature sensors 134, determines that a particular system component 112 does not require cooling, or airflow, the active perforation 120 corresponding to said system component 112 may close to direct airflow to higher risk system components 112, such as system components 112 being heavily utilized. If a particular system component 112 needs to be cooled the thermal regulation system 104 may determine the active perforation(s) 120 nearest the system component 112 requiring the cooling. If the active perforation(s) 120 nearest the system component 112 requiring the cooling is open, the thermal regulation system 104 may maintain the active perforation(s) 120 in the open position. If the active perforation(s) 120 nearest the system component 112 requiring the cooling is closed, the thermal regulation system 104 may activate the microfluidic pump 130 to open said active perforation(s) 120 nearest the system component 112 requiring the cooling.

FIG. 7 illustrates a perspective view of a computer system 200, according to one embodiment described herein. A first area 202, or zone, and a second area 204, or zone, represent locations of the computer system 200 exposed to and in contact with areas outside of the computer system 200. The first area 202 and the second area 204 each represent locations where the thermal regulation system 104 may be located. By positioning the thermal regulation system 104 outside of the computer system 200, fluid Q, such as air, may be directed to direct areas of need within the computer system 200 when required. For example, if the computer system 200 is off, the active perforations 120 of the thermal regulation system 104 within the first area 202 and the second area 204 may be closed or partially open. However, if the computer system 200 is being heavily utilized, the active perforations 120 of the thermal regulation system 104 within the first area 202 and the second area 204 may be opened, or partially opened. However, if the computer system 200 is running but is idling, sleeping, or not in a period of heavy use, the active perforations 120 of the thermal regulation system 104 within the first area 202 and the second area 204 may be in a position between the open position and the closed position, such as partially open. Additionally, a third area 206, fourth area 208, and a fifth area 210 may also benefit from the addition of a thermal regulation system 104 thereon. The third area 206, fourth area 208, and fifth area 210 may encompass areas, or zones, near critical system components 112, such as PCIe cards, graphics cards, and the like, that require active cooling.

In one embodiment, shown in FIG. 8, the thermal regulation system 104 may be a self-activating, self-opening, and/or self-closing thermal regulation system 104. Furthermore, the thermal regulation system 104 may self-power the active perforations 120. The active perforation 120 may be self-powered by operatively connecting a thermoelectric device 160 with the microfluidic pump 130 as part of the thermal regulation system 104. Additionally, the temperature sensor 134 may be in operative communication, such as operatively connected with, the electronic device 100 and/or the thermoelectric device 160. The thermoelectric device 160 may generate power when a change occurs in temperature of the system component 112. The change in temperature of the system component 112 may correspond to a change in voltage generated by the thermoelectric device 160. The magnitude and polarity of the voltage may be dependent upon the magnitude of the change in temperature and polarity of the change in temperature, i.e., whether the change in temperature is positive or negative. Therefore, the thermoelectric device 160 can activate the microfluidic pump 130 when a change in temperature occurs, i.e., when a system component 112 changes state from being utilized and generating heat, to not being utilized and not generating heat. This may allow for the active perforation(s) 120 most near the system component 112 to transform, or change surface features, when the system component 112 is changing state, thus allowing fluid flow, such as airflow, to increase or decrease near the system component 112 depending on whether the system component 112 is being utilized or not. During times when the system component 112 is not being utilized, fluid flow that may typically be supplied to the system component 112 may be redirected to other areas of the electronic device 100, such as to other system components 112, being utilized.

In the embodiment of FIG. 8, the active perforation layer 118 may be a self-activating active perforation layer 118. The self-activation may be caused by an electric charge generated during changes in temperature of the system component 112 monitored by the temperature sensor 134. When a system component 112 is heating up, a voltage may be generated to power the microfluidic pump 130 to open the active perforation 120. Thus, each active perforation 120 of the active perforation layer 118 may open, such as by opening the flaps 144 to the expose the aperture 122, upon the receipt of a first voltage generated by the thermoelectric device 160. When a positive change in temperature, i.e., an increase in temperature, above a normal operating temperature of the system component 112 is received by the temperature sensor 134, a first voltage may be generated by the thermoelectric device 160. The thermoelectric device 160 may power the microfluidic pump 130 via the power supply 140. The magnitude and polarity of the first voltage may be dependent upon the magnitude of the increased change in temperature of the system component 112, and a polarity of the change in temperature may be positive due to the increase in temperature.

Similarly, when a negative change in temperature below and/or within the normal operating temperature of the system component 112 is received by the temperature sensor 134, a second voltage may be generated by the thermoelectric device 160. The thermoelectric device 160 may power the microfluidic pump 130. The microfluidic pump 130 may close the active perforation 120 coupled to the area of the system component 112 that is below and/or within the normal operating temperature which corresponds to the negative change in temperature. The magnitude and polarity of the second voltage may be dependent upon the magnitude of the decreased change in temperature of the system component 112, and a polarity of the change in temperature may be negative due to the decrease in temperature.

Figure 9:
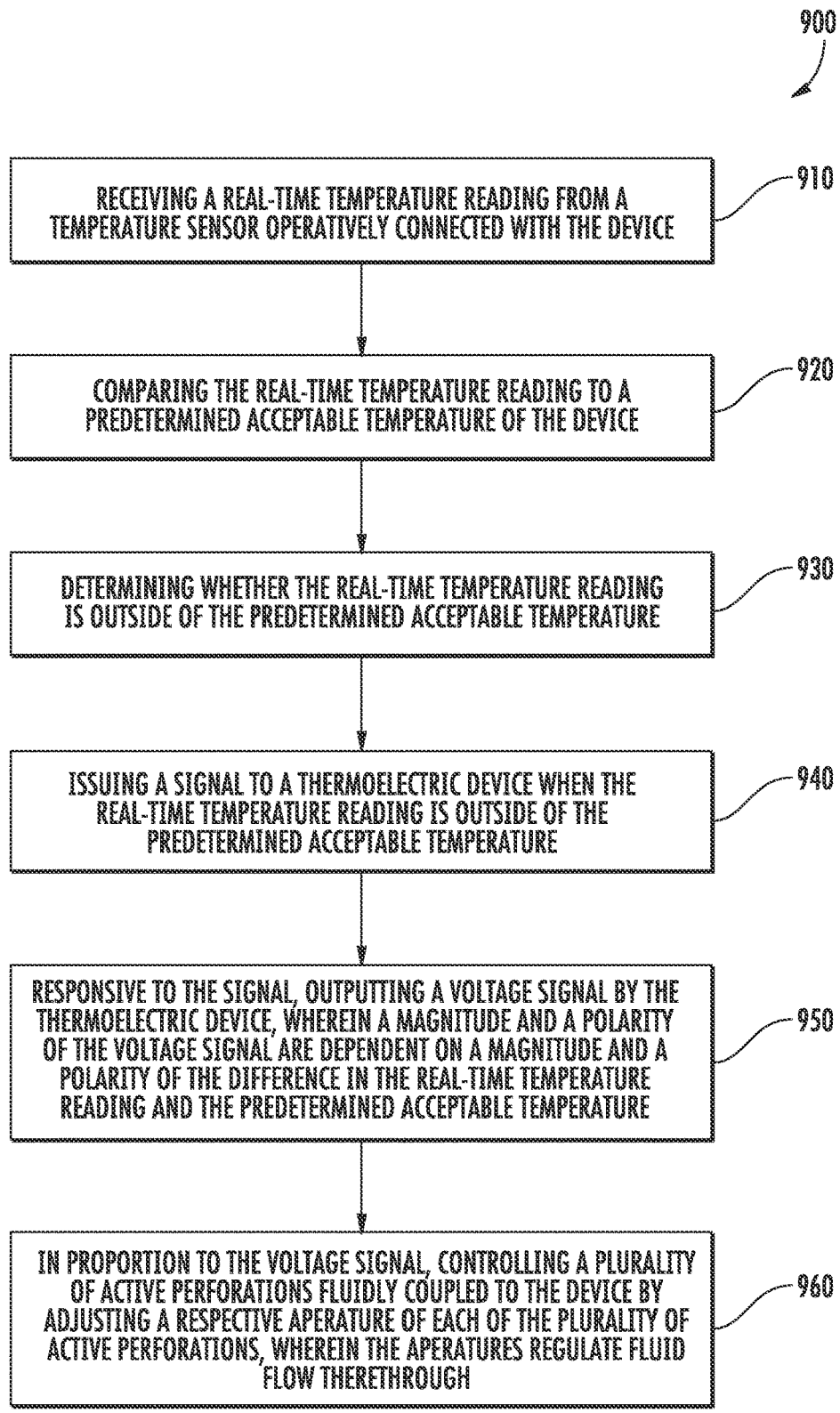
FIG. 9 illustrates a flow diagram of a method for controlling the thermal regulation of a device, according to one embodiment.

FIG. 9 is a flow diagram 900 of a method for controlling the thermal regulation of a device, according to one embodiment. Flow diagram 900 begins at operation 910, in which a real time temperature reading is received from a temperature sensor. The temperature sensor may be operatively connected with the device. The device may be any type of component, such as an electrical component and/or a computer component. The device may be, for example, a Peripheral Component Interconnect Express card (PCIe card), a graphics card, an interconnect, a motherboard, a CPU, etc. At operation 920, the real-time temperature reading is compared to a predetermined acceptable temperature of the device. At operation 930, a determination is made whether the real-time temperature reading is outside of the predetermined acceptable temperature. If the real-time temperature reading is not outside of the predetermined acceptable temperature, then no change occurs.

At operation 940, a signal is issued to a thermoelectric device when the real-time temperature reading outside of the predetermined acceptable temperature. A change in temperature may generate the signal to the thermoelectric device. At operation 950, responsive to the signal, a voltage signal is output by the thermoelectric device, wherein a magnitude and a polarity of the voltage signal are dependent on a magnitude and a polarity of the difference in the real-time temperature reading and the predetermined acceptable temperature.

At operation 960, in proportion of the voltage signal, a plurality of active perforations fluidly coupled to the device are controlled by adjusting a respective aperture of each of the plurality of active perforations, wherein the apertures regulate fluid flow therethrough. The diameter of the aperture may be dependent upon the magnitude and the polarity of the voltage signal, which may depend on the difference in the real-time temperature reading and the predetermined acceptable temperature. A larger aperture allows for more fluid to flow through the aperture. A smaller aperture allows for less fluid to flow through the aperture.

For example, a positive voltage signal may be output by thermoelectric device if the real-time temperature is greater than the predetermined acceptable temperature. Additionally, the plurality of active perforations 120 may open to expose an aperture 122 when the positive voltage signal is received by the plurality of active perforations 120. As such, the diameter of the aperture 122 may correspond with the magnitude of the positive voltage signal received. For example, when a low magnitude positive voltage signal is received by the plurality of active perforations 120 the plurality of active perforations 120 may only slightly open. However, when a large magnitude positive voltage signal is received by the plurality of active perforations 120, the plurality of active perforations 120 may fully open.

By way of additional example, a negative voltage signal may be generated by the thermoelectric device if the real-time temperature is less than the predetermined acceptable temperature. Additionally, the plurality of active perforations 120 may close such that an aperture 122 is not exposed when the negative voltage signal is received by the plurality of active perforations 120. As such, the diameter of the aperture 122 may correspond with the magnitude of the negative voltage signal received. For example, when a low magnitude negative voltage signal is received by the plurality of active perforations 120, the plurality of active perforations 120 may only slightly close. However, when a large magnitude negative voltage signal is received by the plurality of active perforations 120 the plurality of active perforations 120 may fully close.

Optionally, a fan (not shown) may be coupled with the device to increase the fluid flow through an active perforation 120 that is in an open position and/or around an active perforation 120 that is in a closed position. Operations 910-950 may be repeated as the device continues to operate and/or be utilized.

The cooling of servers, computers, electrical components, and other electronic devices or systems can be complicated as regulating and directing the airflow to areas of need therewithin can be challenging. The regulation of air flow for the cooling of critical electrical components may be especially difficult during fan failure scenarios. Active perforations are advantageous to increase and decrease the inlet of air to the system in order to regulate airflow and balance the back pressure in the system. To illustrate, during periods of utilization, especially during maximum utilization, system components may require increased airflow. However, during periods of non-utilization the same system component may not require as much airflow. In such a scenario the active perforation(s) may be opened when the system component is being utilized and closed to redirect the airflow to other system components when not being utilized, thus leading to properly cooled system components and a reduction in exposure time to high temperatures. Overall, equipment failures and damage to the equipment may be prevented.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A device for providing thermal regulation of an electronic component, comprising:
   a thermoelectric device;
   a microfluidic pump operatively connected with the thermoelectric device;
   a temperature sensor in operative communication with the electronic component and the thermoelectric device; and
   a self-activating active perforation layer comprising a plurality of individual active perforations each coupled with an area of the electronic component, wherein the individual active perforations each have a controllable aperture of an adjustable diameter for controlling an amount of fluid allowed to pass therethrough, wherein when a positive change in temperature above a normal operating temperature of the electronic component is received by the temperature sensor a voltage is generated by the thermoelectric device which powers the microfluidic pump, wherein powering the microfluidic pump expands a reservoir to affect the adjustable diameter of the individual active perforations coupled to the area of the electronic component corresponding to the positive change in temperature.

2. The device of claim 1, wherein a magnitude and a polarity of the voltage is dependent upon a magnitude and a polarity of the change in temperature of the electronic component.

3. The device of claim 1, wherein when the electronic component is in an off state the plurality of individual active perforations are in a closed position.

4. The device of claim 1, further comprising a fan coupled with the device for moving fluid through or around the individual active perforations.

5. The device of claim 4, wherein when the individual active perforations are closed, fluid flow is redirected around the individual active perforations.

6. The device of claim 1, wherein the reservoir is an expandable reservoir, and wherein the self-activating active perforation layer further comprises:
   an elastomeric layer;
   a fluid channel;
   and
   an operating fluid for flowing through the fluid channel, wherein the operating fluid expands the expandable reservoir upon entering the fluid channel, and contracts the expandable reservoir upon exiting the fluid channel.

7. The device of claim 6, wherein the operating fluid is a liquid.

8. The device of claim 1, wherein the self-activating active perforation layer is a polymer material.

9. The device of claim 1, further comprising a controller, wherein the controller comprises a computer-readable medium storing instructions that, when executed by a processor, cause the controller to activate the thermal regulation system, by performing an operation comprising:
   receiving a real-time temperature reading from the temperature sensor;
   comparing the real-time temperature reading to a predetermined acceptable temperature of the electronic component;
   determining whether the real-time temperature reading is outside of the predetermined acceptable temperature;
   issuing a signal to the thermoelectric device when the real-time temperature reading is outside of the predetermined acceptable temperature;
   responsive to the signal, outputting a voltage signal by the thermoelectric device, wherein a magnitude and a polarity of the voltage signal are dependent on a magnitude and a polarity of the difference in the real-time temperature reading and the predetermined acceptable temperature; and
   in proportion to the voltage signal, controlling the plurality of individual active perforations by adjusting the respective controllable apertures of each of the plurality of individual active perforations.

10. A device for providing thermal regulation of an electronic component, comprising:
    a thermoelectric device;
    a microfluidic pump operatively connected with the thermoelectric device;
    a temperature sensor in operative communication with the electronic component and the thermoelectric device; and
    a self-activating active perforation layer, having a plurality of individual active perforations each coupled with an area of the electronic component, wherein the individual active perforations each have a controllable aperture of an adjustable diameter for controlling an amount of fluid allowed to pass therethrough, wherein when a negative change in temperature below a normal operating temperature of the electronic component is received by the temperature sensor a voltage is generated by the thermoelectric device which powers the microfluidic pump, wherein powering the microfluidic pump contracts a reservoir to affect the adjustable diameter of the individual active perforations coupled to the area of the electronic component corresponding to the negative change in temperature.

11. The device of claim 10, wherein a magnitude and a polarity of the voltage is dependent upon a magnitude and a polarity of the change in temperature of the electronic component.

12. The device of claim 10, wherein when the electronic component is in an off state the plurality of individual active perforations are in a closed position.

13. The device of claim 10, wherein the reservoir is an expandable reservoir, and wherein the self-activating active perforation layer further comprises:
    an elastomeric layer;
    a fluid channel;
    and
    an operating fluid for flowing through the fluid channel, wherein the operating fluid expands the expandable reservoir upon entering the fluid channel, and contracts the expandable reservoir upon exiting the fluid channel.

14. The device of claim 13, wherein the operating fluid is a liquid.

15. The device of claim 10, wherein the self-activating active perforation layer is a polymer material.

16. The device of claim 10, further comprising a controller, wherein the controller comprises a computer-readable medium storing instructions that, when executed by a processor, cause the controller to activate the thermal regulation system, by performing an operation comprising:
    receiving a real-time temperature reading from the temperature sensor;
    comparing the real-time temperature reading to a predetermined acceptable temperature of the electronic component;

determining whether the real-time temperature reading is outside of the predetermined acceptable temperature;

issuing a signal to the thermoelectric device when the real-time temperature reading is outside of the predetermined acceptable temperature;

responsive to the signal, outputting a voltage signal by the thermoelectric device, wherein a magnitude and a polarity of the voltage signal are dependent on a magnitude and a polarity of the difference in the real-time temperature reading and the predetermined acceptable temperature; and in proportion to the voltage signal, controlling the plurality of individual active perforations by adjusting the respective controllable apertures of each of the plurality of individual active perforations.

17. A device for providing thermal regulation of an electronic component, comprising:

a thermoelectric device;

a microfluidic pump operatively connected with the thermoelectric device;

a temperature sensor in operative communication with the electronic component and the thermoelectric device; and a self-activating active perforation layer coupled to the electronic component, the self-activating active perforation layer comprising at least two active perforations thereon, wherein the at least two active perforations each have a controllable aperture of an adjustable diameter for controlling an amount of fluid flow therethrough to the electronic component, wherein the controllable aperture of the first active perforation is individually controllable from the controllable aperture of the second active perforation, and wherein when a positive change in temperature above a normal operating temperature of the electronic component is received by the temperature sensor a first voltage and a second voltage are generated by the thermoelectric device which powers the microfluidic pump to control a reservoir to affect the controllable diameter of the first active perforation in proportion to the first voltage and to control to the second active perforation in proportion to the second voltage.

18. The device of claim 17, wherein controlling the first active perforation in proportion to the first voltage comprises opening or closing the first active perforation, and wherein controlling the second active perforation in proportion to the second voltage comprises opening or closing the second active perforation.

19. The device of claim 17, wherein a magnitude and a polarity of the first voltage and the second voltage is dependent upon a magnitude and a polarity of the change in temperature of the electronic component.

20. The device of claim 17, wherein the self-activating active perforation layer is a polymer material.

* * * * *